(12) United States Patent  (10) Patent No.: US 8,039,062 B2
Heys et al.  (45) Date of Patent: Oct. 18, 2011

(54) METHODS OF ATOMIC LAYER DEPOSITION USING HAFNIUM AND ZIRCONIUM-BASED PRECURSORS

(75) Inventors: Peter Nicholas Heys, Crewe (GB); Andrew Kingsley, Chester (GB); Fuquan Song, Wirral (GB); Paul Williams, Merseyside (GB); Thomas Leese, Stoke-On-Trent (GB); Hywel Owen Davies, Mold (GB); Rajesh Odedra, Altrincham (GB)

(73) Assignee: Sigma-Aldrich Co. LLC, St. Louis, MO (US)

( * ) Notice: Subject to any disclaimer, the term of this patent is extended or adjusted under 35 U.S.C. 154(b) by 324 days.

(21) Appl. No.: 12/207,968

(22) Filed: Sep. 10, 2008

(65) Prior Publication Data
US 2009/0081385 A1  Mar. 26, 2009

Related U.S. Application Data

(60) Provisional application No. 60/972,451, filed on Sep. 14, 2007.

(51) Int. Cl.
*C23C 8/00* (2006.01)
*C23C 16/00* (2006.01)
(52) U.S. Cl. .................................. 427/585; 427/248.1
(58) Field of Classification Search .................. 427/585, 427/248.1
See application file for complete search history.

(56) References Cited

U.S. PATENT DOCUMENTS

| 4,581,249 A | 4/1986 | Kamiya | 427/53.1 |
| 5,393,564 A | 2/1995 | Westmoreland et al. | 427/248.1 |
| 5,625,086 A | 4/1997 | Lisowsky | 556/54 |
| 7,091,129 B2 * | 8/2006 | Chau et al. | 438/707 |

(Continued)

FOREIGN PATENT DOCUMENTS

JP  2005/171291  6/2005
(Continued)

OTHER PUBLICATIONS

George, S.M., et. al. Surface Chemistry for Atomic Layer Growth. J. Phys. Chem. 100: 13121-13131 (1996).

(Continued)

*Primary Examiner* — Kelly M Gambetta
(74) *Attorney, Agent, or Firm* — Harness, Dickey & Pierce, P.L.C.

(57) ABSTRACT

Methods of forming a metal-containing film by atomic layer deposition is provided. The methods comprise delivering at least one precursor to a substrate, wherein the at least one precursor corresponds in structure to Formula II:

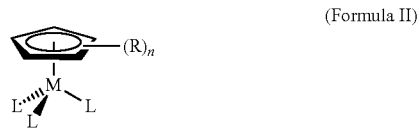

(Formula II)

wherein: M is Hf or Zr; R is $C_1$-$C_6$-alkyl; n is zero, 1, 2, 3, 4 or 5; L is $C_1$-$C_6$-alkoxy. Further methods are provided of forming a metal-containing film by liquid injection atomic layer deposition. The methods comprise delivering at least one precursor to a substrate, wherein the at least one precursor corresponds in structure to Formula III:

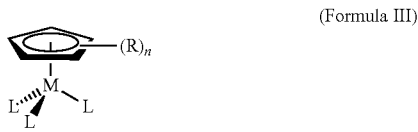

(Formula III)

wherein: M is Hf or Zr; R is $C_1$-$C_6$-alkyl; n is zero, 1, 2, 3, 4 or 5; L is amino, wherein the amino is optionally independently substituted 1 or 2 times with $C_1$-$C_6$-alkyl.

25 Claims, 4 Drawing Sheets

U.S. PATENT DOCUMENTS

| | | | |
|---|---|---|---|
| 2007/0122947 A1 | 5/2007 | Sakurai | 427/255.35 |
| 2008/0213940 A1 | 9/2008 | Lee et al. | 438/104 |
| 2008/0274615 A1* | 11/2008 | Vaartstra | 438/685 |
| 2009/0074983 A1 | 3/2009 | Heys et al. | 427/569 |

FOREIGN PATENT DOCUMENTS

| | | | |
|---|---|---|---|
| KR | 20080101040 | | 11/2008 |
| WO | WO 2006/131751 | | 12/2006 |
| WO | WO 2007/066546 | * | 6/2007 |
| WO | WO 2007/140813 | | 12/2007 |
| WO | WO 2007/141059 | | 12/2007 |
| WO | WO 2009/036045 | | 3/2009 |
| WO | WO 2009/036046 | | 3/2009 |
| WO | WO 2009/106433 | | 9/2009 |

OTHER PUBLICATIONS

Potter, R.J., et. al. Deposition of HfO2, Gd2O3 and PrOx by Liquid Iinjection ALD Techniques. Chem. Vap. Deposition 11: 159-169 (2005).

Wu, Q., et. al. Diphenyl substituted cyclopentadienyl titanium trichloride derivatives: Synthesis, crystal structure and properties as catalysts for styrene polymerization. Polyhedron 25: 2565-2570 (2006).

An, J., et. al. Piano stool complexes containing the bulky pentaphenylcyclopentadienyl (C5Ph5) ligand: Preparation, characterization and X-ray structure of C5Ph5Zr(N(CH3)2)3 (I). Journal of Organometallic Chemistry 690: 4376-4380 (2005).

Niinisto, et. al. ALD of ZrO2 Thin Films Exploiting Novel Mixed Alkylamido-Cyclopentadienyl Precursors. E-MRS Fall Meeting 2007. Oral Presentation. Sep. 18, 2007. Warsaw, Poland.

International Search Report for PCT/US2008/075831 dated Jan. 14, 2009.

Jones, A.C., et. al. (2006) "MOCVD and ALD of High-K Dielectric Oxides Using Alkoxide Precursors." Chem. Vap. Deposition 12: 83-98.

Rushworth S., et. al. Thermal Stability Studies for Advanced Hafnium and Zirconium ALD Precursors, Surface & Coating Technology, 201 (2007) 9060-9065.

Wright, P.J., et al. (2002) "Metal Organic Chemical Vapor Deposition (MOCVD) of Oxides and Ferroelectric Materials" Journal of Materials Science: Materials in Electronics 13:671-678.

International Search Report for PCT/US2008/075830 dated Feb. 11, 2009.

Office Action dated Nov. 17, 2010 in U.S. Appl. No. 12/207,973.

* cited by examiner

METHODS OF ATOMIC LAYER DEPOSITION USING HAFNIUM AND ZIRCONIUM-BASED PRECURSORS

CROSS-REFERENCED APPLICATIONS

This application claims priority to U.S. provisional application Ser. No. 60/972,451 filed on 14 Sep. 2007, the disclosure of which is incorporated by reference in its entirety. Disclosure of copending U.S. provisional application Ser. No. 60/972,488 filed on 14 Sep. 2007, is incorporated herein by reference in its entirety without admission that such disclosure constitutes prior art to the present invention.

FIELD OF THE INVENTION

The present invention relates to methods of preparing thin films by atomic layer deposition (ALD) using hafnium and/or zirconium-based precursors.

BACKGROUND OF THE INVENTION

ALD is a known method for the deposition of thin films. It is a self-limiting, sequential unique film growth technique based on surface reactions that can provide atomic layer control and deposit conformal thin films of materials provided by precursors onto substrates of varying compositions. In ALD, the precursors are separated during the reaction. The first precursor is passed over the substrate producing a monolayer on the substrate. Any excess unreacted precursor is pumped out of the reaction chamber. A second precursor is then passed over the substrate and reacts with the first precursor, forming a monolayer of film on the substrate surface. This cycle is repeated to create a film of desired thickness.

ALD processes have applications in nanotechnology and fabrication of semiconductor devices such as capacitor electrodes, gate electrodes, adhesive diffusion barriers and integrated circuits. Further, dielectric thin films having high dielectric constants (permittivities) are necessary in many sub-areas of microelectronics and optelectronics. The continual decrease in the size of microelectronics components has increased the need for the use of such dielectric films.

Japanese Patent Application No. P2005-171291 reports titanium-based precursors for use in chemical vapor deposition.

Current precursors for use in ALD do not provide the required performance to implement new processes for fabrication of next generation devices, such as semi-conductors. For example, improved thermal stability, higher volatility or increased deposition rates are needed.

SUMMARY OF THE INVENTION

There is now provided methods of forming metal-containing films by atomic layer deposition. The methods comprise delivering at least one precursor to a substrate, wherein the at least one precursor corresponds to Formula II:

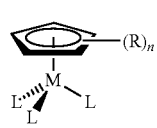

(Formula II)

wherein:
M is Hf or Zr;
R is $C_1$-$C_6$-alkyl;
n is zero, 1, 2, 3, 4 or 5;
L is $C_1$-$C_6$-alkoxy.

In another embodiment, methods of forming metal-containing films by liquid injection atomic layer deposition are provided, wherein the methods comprise delivering at least one precursor to a substrate, wherein the at least one precursor corresponds in structure to Formula III:

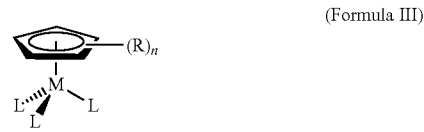

(Formula III)

wherein:
M is Hf or Zr;
R is $C_1$-$C_6$-alkyl;
n is zero, 1, 2, 3, 4 or 5;
L is amino, wherein the amino is optionally independently substituted 1 or 2 times with $C_1$-$C_6$-alkyl.

Other embodiments, including particular aspects of the embodiments summarized above, will be evident from the detailed description that follows.

DETAILED DESCRIPTION OF THE INVENTION

Figure 1:
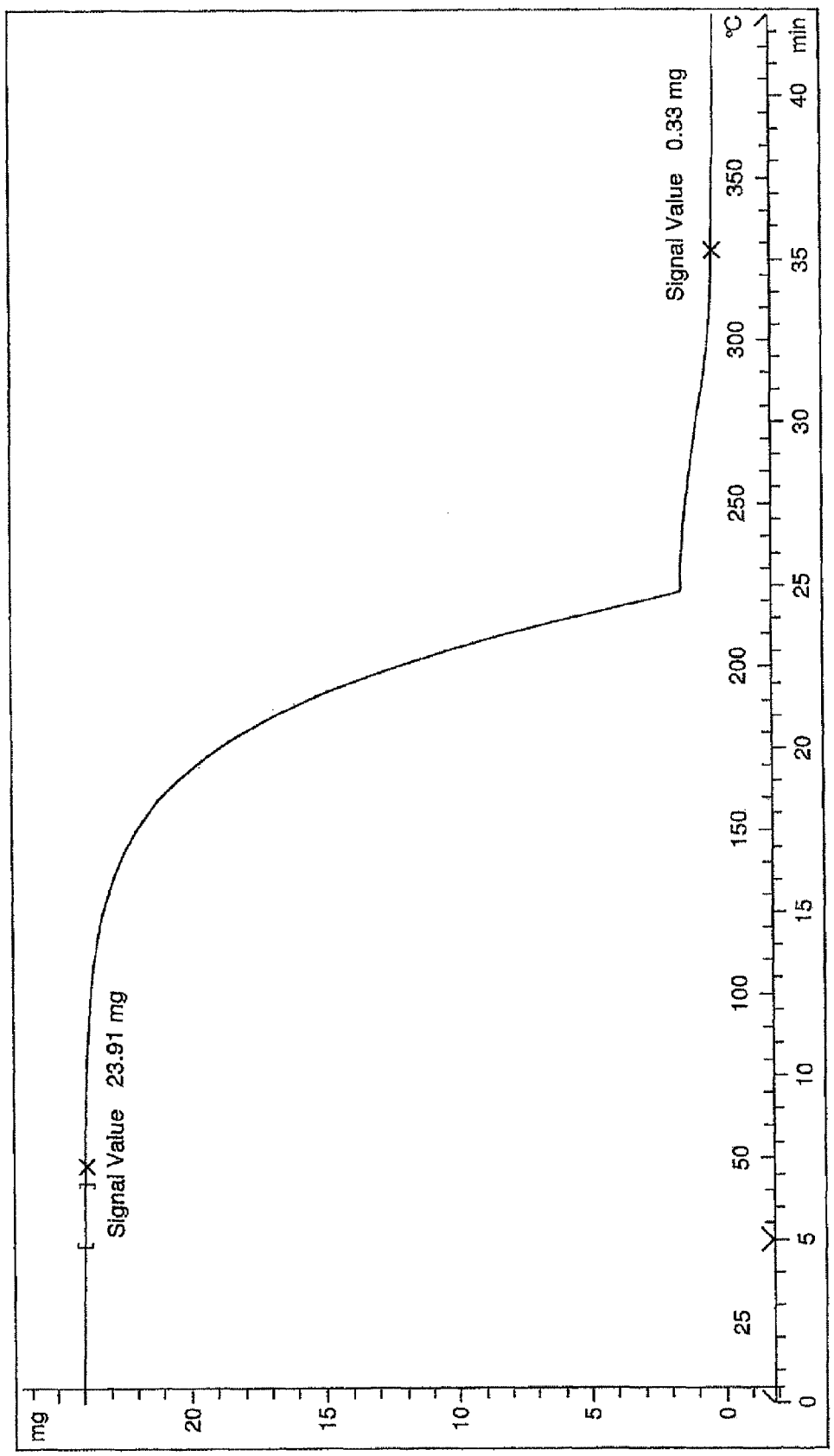
FIG. 1 is a graphical representation of thermogravimetric analysis (TGA) data demonstrating mg vs. temperature/time of $(MeCp)Hf(OtBu)_3$.
Figure 2:
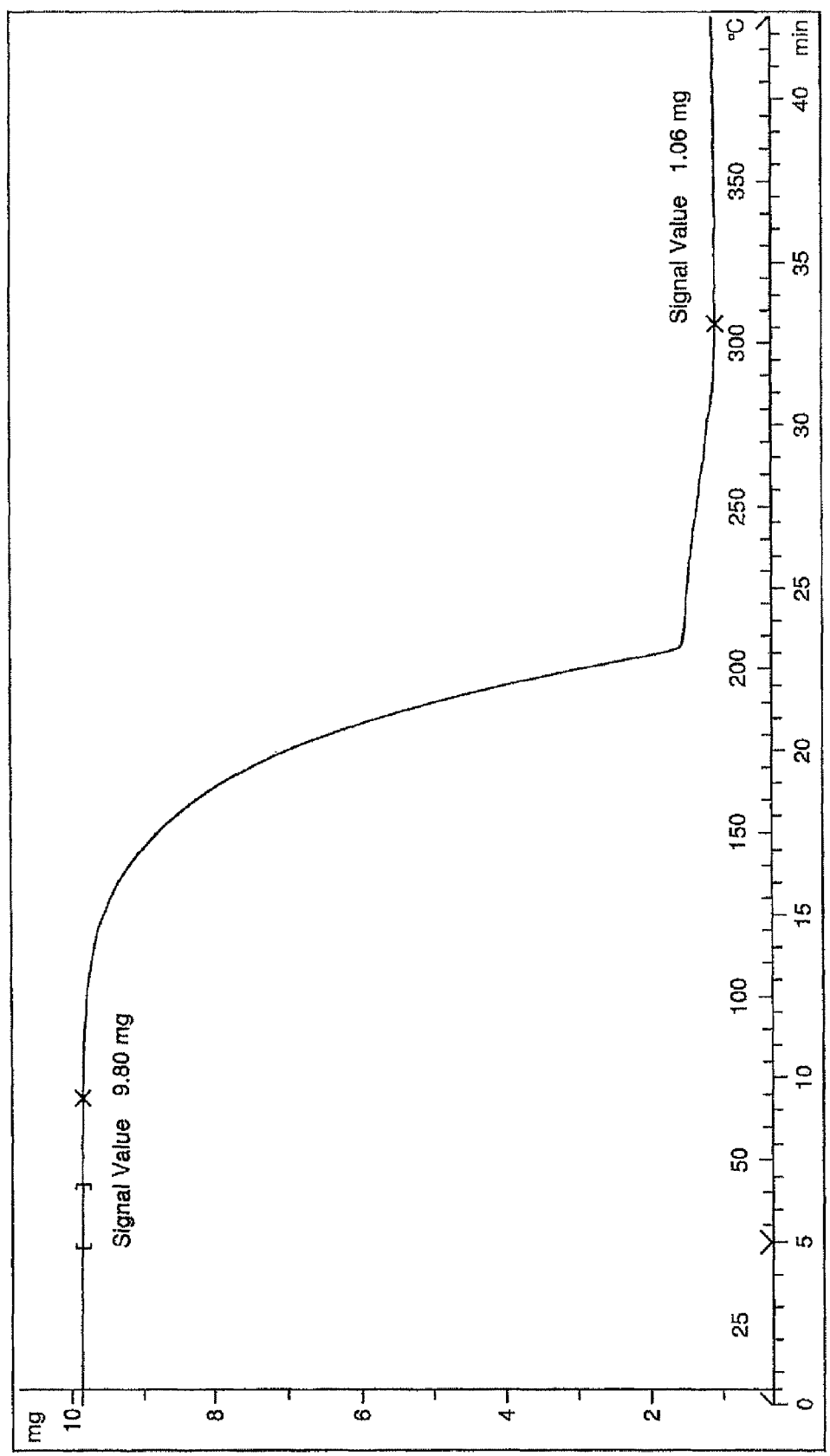
FIG. 2 is a graphical representation of TGA data demonstrating mg vs. temperature/time of $(MeCp)Hf(NMe_2)_3$.
Figure 3:
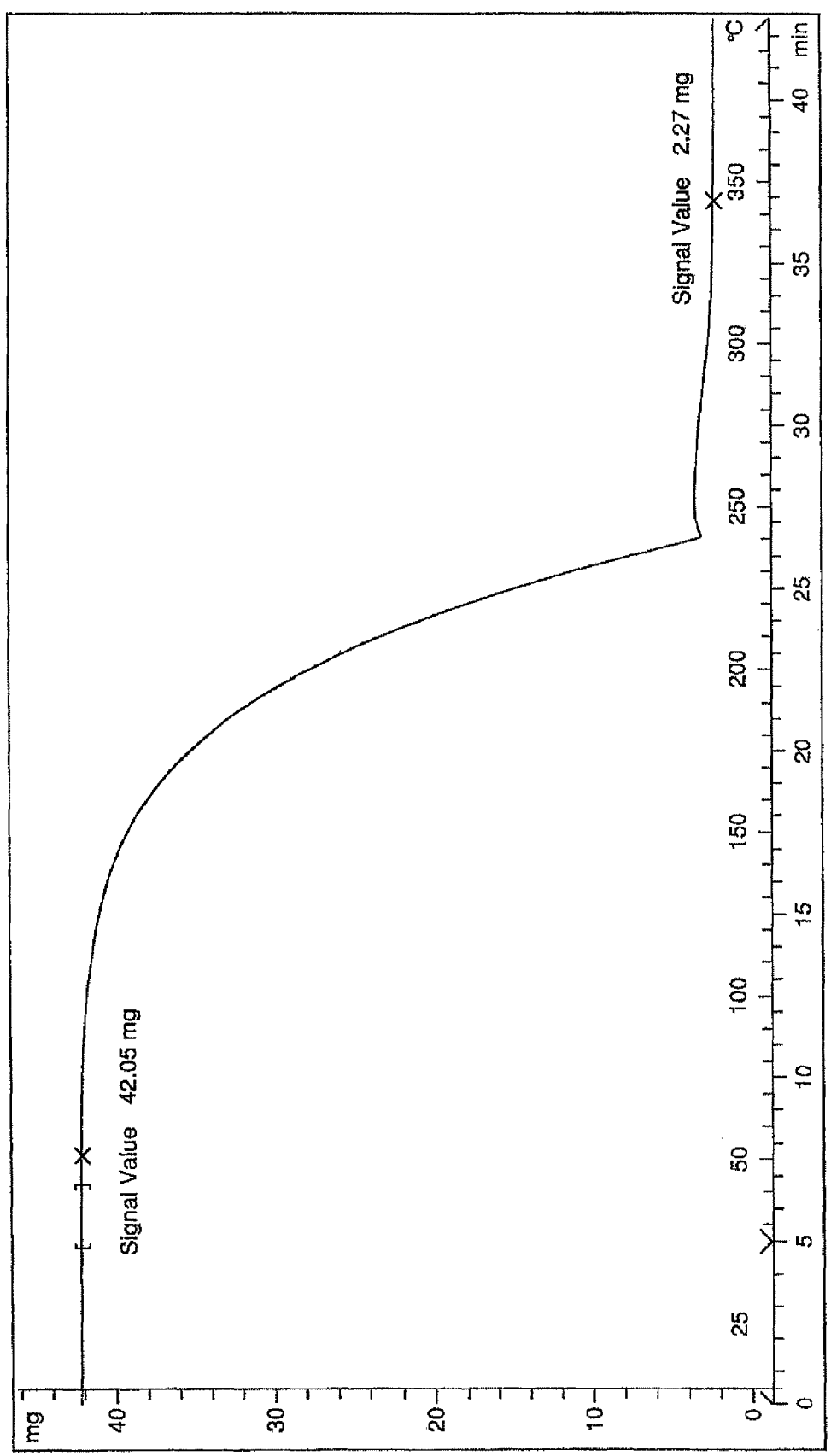
FIG. 3 is a graphical representation of TGA data demonstrating mg vs. temperature/time of $(MeCp)Zr(OtBu)_3$.
Figure 4:
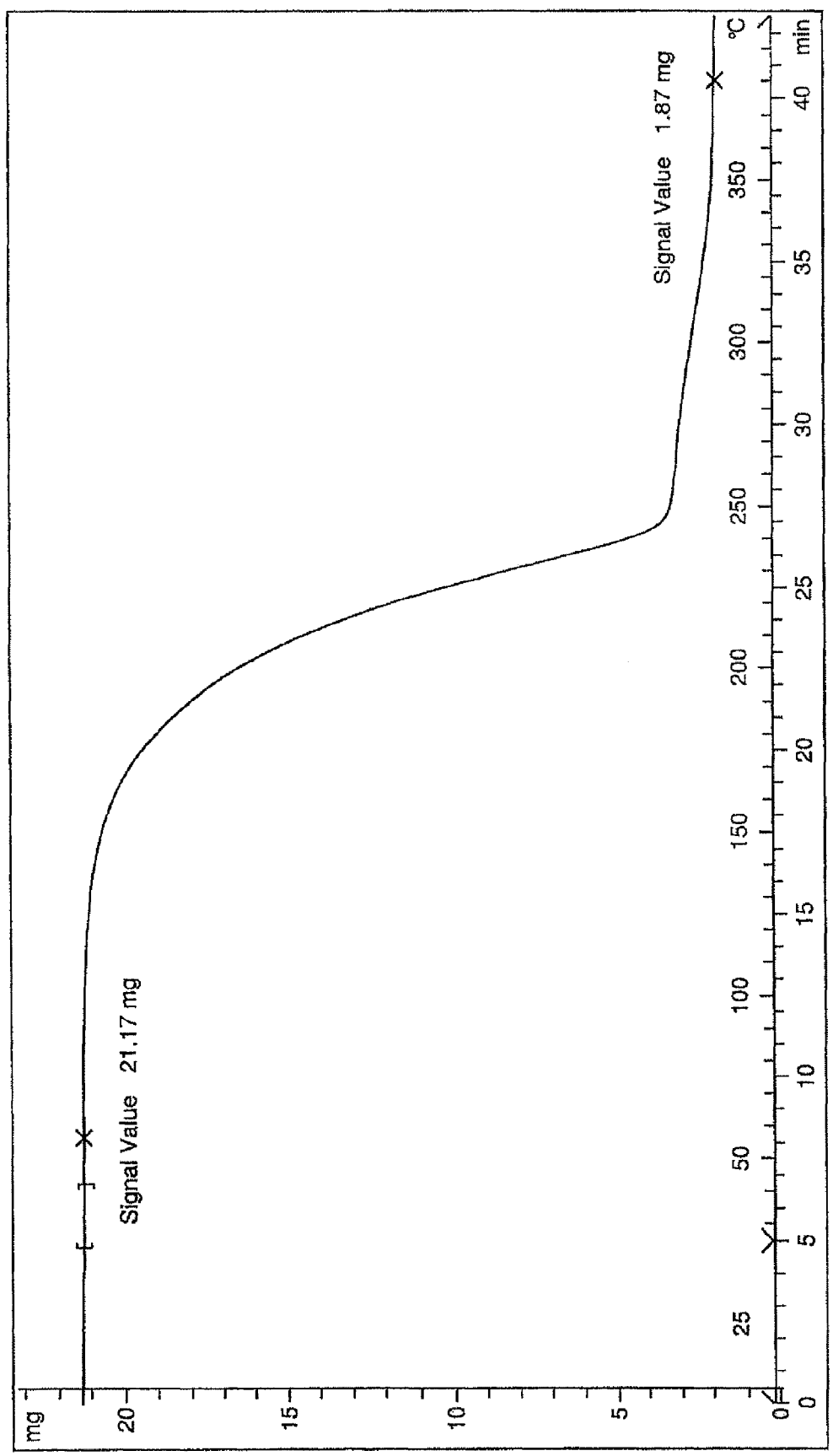
FIG. 4 is a graphical representation of TGA data demonstrating mg vs. temperature/time of $(MeCp)Zr(NMe_2)_3$.

In various aspects of the invention, methods are provided which utilize hafnium-based and/or zirconium-based precursors to form various hafnium-containing and/or zirconium-containing films by ALD.

The methods of the invention are used to create or grow titanium-containing thin films which display high dielectric constants. A dielectric thin film as used herein refers to a thin film having a high permittivity. The films created herein by ALD are dielectric thin films.

Although not admitted as prior art, International Patent Publication No. WO 2007/066546 of Tri Chemical Laboratories, published on 14 Jun. 2007, reports hafnium-based precursors for forming a hafnium-based film by a chemical vapor deposition process or an atomic layer deposition process.

Although not admitted as prior art, International Publication No. WO 2007/141059 of Air Liquide Societe, published on 13 Dec. 2007, reports a method of forming dielectric films such as hafnium or zirconium oxide films.

Further, although not admitted as prior art, an abstract by Niinistö J., et al. entitled "ALD of $ZrO_2$ Thin Films Exploiting Novel Mixed Alkylamido-Cyclopentadienyl Precursors" (See http://science24.com/paper/11894) reports the use of $(EtCp)Zr(NMe_2)_3$ for forming a metal oxide film by ALD.

A. DEFINITIONS

As used herein, the term "precursor" refers to an organometallic molecule, complex and/or compound which is delivered to a substrate for deposition to form a thin film by ALD.

The organometallic precursor of the invention has at least one metallic center comprising a transition metal ("M"). In particular, there is one metal center and M is hafnium or zirconium.

The term "Cp" refers to a cyclopentadienyl ($C_5H_5$) ligand which is bound to a transition metal. As used herein, all five carbon atoms of the Cp ligand are bound to the metal center in $\eta^5$-coordination by $\pi$ bonding, therefore the precursors of the invention are $\pi$ complexes.

The term "alkyl" refers to a saturated hydrocarbon chain of 1 to about 6 carbon atoms in length, such as, but not limited to, methyl, ethyl, propyl and butyl. The alkyl group may be straight-chain or branched-chain. For example, as used herein, propyl encompasses both n-propyl and iso-propyl; butyl encompasses n-butyl, sec-butyl, iso-butyl and tert-butyl. Further, as used herein, "Me" refers to methyl, and "Et" refers to ethyl.

The term "amino" herein refers to an optionally substituted monovalent nitrogen atom (i.e., $-NR^1R^2$, where $R^1$ and $R^2$ can be the same or different). Examples of amino groups encompassed by the invention include but are not limited to

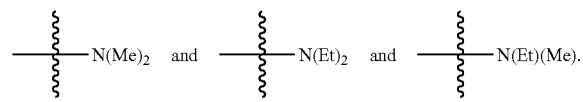

Further, the nitrogen atom of this amino group is covalently bonded to the metal center which together may be referred to as an "amide" group (i.e.

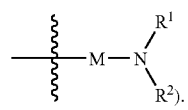

This can be further referred to as an "ammono" group or inorganic amide, for example

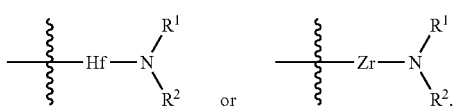

B. METHODS OF USE

In a first embodiment, a method of forming a metal-containing film by atomic layer deposition is provided. The method comprises delivering at least one precursor to a substrate, wherein the at least one precursor corresponds in structure to Formula I:

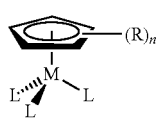

(Formula I)

wherein:
M is Hf or Zr;
R is $C_1$-$C_6$-alkyl;

n is zero, 1, 2, 3, 4 or 5;
L is $C_1$-$C_6$-alkoxy or amino, wherein the amino is optionally independently substituted 1 or 2 times with $C_1$-$C_6$-alkyl.

In one embodiment, the at least one precursor corresponds in structure to Formula I, wherein
M is Hf
R is methyl, ethyl or propyl;
n is zero, 1 or 2; and
L is selected from the group consisting of methoxy, ethoxy, propoxy, butoxy, dimethylamino, ethylmethylamino, and diethylamino.

In another embodiment, the at least one precursor corresponds in structure to Formula I, wherein
M is Hf
R is methyl or ethyl;
n is 1 or 2; and
L is selected from the group consisting of methoxy, ethoxy, propoxy, butoxy, dimethylamino, ethylmethylamino, and diethylamino.

In another embodiment, the at least one precursor corresponds in structure to Formula I, wherein
M is Hf
R is methyl or ethyl;
n is 1; and
L is selected from the group consisting of methoxy, ethoxy, propoxy, and butoxy.

In another embodiment, the at least one precursor corresponds in structure to Formula I, wherein
M is Zr;
R is methyl, ethyl or propyl;
n is zero, 1 or 2; and
L is selected from the group consisting of methoxy, ethoxy, propoxy, butoxy, dimethylamino, ethylmethylamino, and diethylamino.

In another embodiment, the at least one precursor corresponds in structure to Formula I, wherein
M is Zr;
R is methyl or ethyl;
n is 1 or 2; and
L is selected from the group consisting of methoxy, ethoxy, propoxy, butoxy, dimethylamino, ethylmethylamino, and diethylamino.

In another embodiment, the at least one precursor corresponds in structure to Formula I, wherein
M is Zr;
R is methyl or ethyl;
n is 1; and
L is selected from the group consisting of methoxy, ethoxy, propoxy and butoxy.

In another embodiment, a method of forming a metal-containing film by atomic layer deposition is provided, wherein the method comprises delivering at least one precursor to a substrate, wherein the at least one precursor corresponds in structure to Formula II:

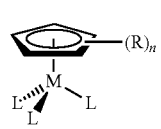

(Formula II)

wherein:
M is Hf or Zr;
R is $C_1$-$C_6$-alkyl;
n is zero, 1, 2, 3, 4 or 5;

L is $C_1$-$C_6$-alkoxy.

In one embodiment, the at least one precursor corresponds in structure to Formula II wherein
M is Hf
R is methyl, ethyl or propyl;
n is zero, 1 or 2; and
L is selected from the group consisting of methoxy, ethoxy, propoxy and butoxy.

In one embodiment, the at least one precursor corresponds in structure to Formula II wherein
M is Hf
R is methyl or ethyl;
n is 1 or 2; and
L is selected from the group consisting of methoxy, ethoxy, propoxy and butoxy.

In one embodiment, the at least one precursor corresponds in structure to Formula II wherein
M is Hf
R is methyl or ethyl;
n is 1; and
L is selected from the group consisting of methoxy, ethoxy, propoxy, and butoxy.

In one embodiment, the at least one precursor corresponds in structure to Formula II wherein
M is Zr;
R is methyl, ethyl or propyl;
n is zero, 1 or 2; and
L is selected from the group consisting of methoxy, ethoxy, propoxy and butoxy.

In one embodiment, the at least one precursor corresponds in structure to Formula II wherein
M is Zr;
R is methyl or ethyl;
n is 1 or 2; and
L is selected from the group consisting of methoxy, ethoxy, propoxy and butoxy.

In one embodiment, the at least one precursor corresponds in structure to Formula II wherein
M is Zr;
R is methyl or ethyl;
n is 1; and
L is selected from the group consisting of methoxy, ethoxy, propoxy and butoxy.

In another embodiment, a method of forming a metal-containing film by atomic layer deposition is provided, wherein the method comprises delivering at least one precursor to a substrate, wherein the at least one precursor corresponds in structure to Formula III:

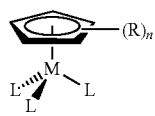

(Formula III)

wherein:
M is Hf or Zr;
R is $C_1$-$C_6$-alkyl;
n is zero, 1, 2, 3, 4 or 5;
L is amino, wherein the amino is optionally independently substituted 1 or 2 times with $C_1$-$C_6$-alkyl.

In one embodiment, the at least one precursor corresponds in structure to Formula III, wherein
M is Hf or Zr;
R is $C_1$-$C_6$-alkyl;
n is zero, 1 or 2;
L is amino, wherein the amino is optionally independently substituted 1 or 2 times with $C_1$-$C_6$-alkyl.

In another embodiment, the at least one precursor corresponds in structure to Formula III, wherein
M is Hf or Zr;
R is $C_1$-$C_6$-alkyl;
n is 3, 4 or 5;
L is amino, wherein the amino is optionally independently substituted 1 or 2 times with $C_1$-$C_6$-alkyl.

In one embodiment, the at least one precursor corresponds in structure to Formula I, II or III, wherein butyl is selected from the group consisting of n-butyl, sec-butyl, iso-butyl and tert-butyl. In a particular embodiment, butyl is tert-butyl.

In one embodiment, the at least one precursor corresponds in structure to Formula I, II or III, wherein propyl is selected from the group consisting of n-propyl and iso-propyl. In a particular embodiment, propyl is iso-propyl.

In one embodiment of the invention, the at least one precursor corresponding in structure to Formula I, II or III is selected from the group consisting of:
(methylcyclopentadienyl)Hf(NMe$_2$)$_3$;
(ethylcyclopentadienyl)Hf(NMe$_2$)$_3$;
(propylcyclopentadienyl)Hf(NMe$_2$)$_3$;
(methylcyclopentadienyl)Hf(NEt$_2$)$_3$;
(ethylcyclopentadienyl)Hf(NEt$_2$)$_3$;
(propylcyclopentadienyl)Hf(NEt$_2$)$_3$;
(methylcyclopentadienyl)Hf(NMeEt)$_3$;
(ethylcyclopentadienyl)Hf(NMeEt)$_3$;
(propylcyclopentadienyl)Hf(NMeEt)$_3$;
(methylcyclopentadienyl) Hf(OMe)$_3$;
(ethylcyclopentadienyl)Hf(OMe)$_3$;
(propylcyclopentadienyl)Hf(OMe)$_3$;
(methylcyclopentadienyl)Hf(OEt)$_3$;
(ethylcyclopentadienyl)Hf(OEt)$_3$;
(propylcyclopentadienyl)Hf(OEt)$_3$;
(methylcyclopentadienyl)Hf(OiPr)$_3$;
(ethylcyclopentadienyl)Hf(OiPr)$_3$;
(propylcyclopentadienyl)Hf(OiPr)$_3$;
(methylcyclopentadienyl)Hf(OtBu)$_3$;
(ethylcyclopentadienyl)Hf(OtBu)$_3$;
(propylcyclopentadienyl)Hf(OtBu)$_3$;
(methylcyclopentadienyl)Zr(NMe$_2$)$_3$;
(ethylcyclopentadienyl)Zr(NMe$_2$)$_3$;
(propylcyclopentadienyl)Zr(NMe$_2$)$_3$;
(methylcyclopentadienyl)Zr(NEt$_2$)$_3$;
(ethylcyclopentadienyl)Zr(NEt$_2$)$_3$;
(propylcyclopentadienyl)Zr(NEt$_2$)$_3$;
(methylcyclopentadienyl)Zr(NMeEt)$_3$;
(ethylcyclopentadienyl)Zr(NMeEt)$_3$;
(propylcyclopentadienyl)Zr(NMeEt)$_3$;
(methylcyclopentadienyl)Zr(OMe)$_3$;
(ethylcyclopentadienyl)Zr(OMe)$_3$;
(propylcyclopentadienyl)Zr(OMe)$_3$;
(methylcyclopentadienyl)Zr(OEt)$_3$;
(ethylcyclopentadienyl)Zr(OEt)$_3$;
(propylcyclopentadienyl)Zr(OEt)$_3$;
(methylcyclopentadienyl)Zr(OiPr)$_3$;
(ethylcyclopentadienyl)Zr(OiPr)$_3$;
(propylcyclopentadienyl)Zr(OiPr)$_3$;
(methylcyclopentadienyl)Zr(OtBu)$_3$;
(ethylcyclopentadienyl)Zr(OtBu)$_3$; and
(propylcyclopentadienyl)Zr(OtBu)$_3$.

In a particular embodiment, the at least one precursor corresponding to Formula I, II or III is selected from the group consisting of:

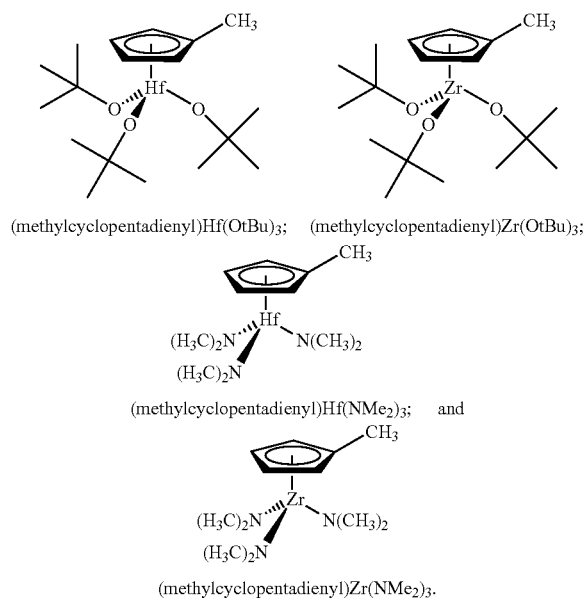

(methylcyclopentadienyl)Hf(OtBu)₃; (methylcyclopentadienyl)Zr(OtBu)₃;

(methylcyclopentadienyl)Hf(NMe₂)₃; and (methylcyclopentadienyl)Zr(NMe₂)₃.

C. TYPES OF METAL-CONTAINING FILMS

The methods of the invention can be used to form a variety of metal-containing films using at least one organometallic precursor according to Formula I-III. In a particular embodiment, a hafnium, hafnium oxide, hafnium nitride, zirconium, zirconium oxide, zirconium nitride or combination thereof film is formed by ALD.

In a particular embodiment, a hafnium and/or zirconium oxide film is deposited onto a substrate. The at least one precursor according to Formula I-III may be delivered for deposition to a substrate in pulses alternating with pulses of an appropriate oxygen source, such as $H_2O$, $O_2$ and/or ozone.

In another embodiment a metal-containing film can be formed by delivering for deposition at least one precursor according to Formula I-III, independently or in combination with a co-reactant. Examples of such co-reactants include, but are not limited to hydrogen, hydrogen plasma, oxygen, air, water, $H_2O_2$, ammonia, hydrazines, allylhydrazines, boranes, silanes, ozone or any combination thereof.

In another embodiment, a method is provided for forming a "mixed" metal film by ALD. The term "mixed" metal film as used herein is to indicate that at least two different metals comprise the film.

In one embodiment, a mixed metal film is formed by ALD by delivering for deposition at least two precursors according to Formula I-III. Non-limiting examples of such films include hafnium zirconium oxide and hafnium zirconium nitride films.

In another embodiment, a mixed metal film is formed by ALD by delivering for deposition at least one precursor according to Formula I-III and at least one co-precursor, wherein the co-precursor falls outside of Formula I-III. For example, at least one hafnium and/or zirconium precursor according to Formula I-III and at least one appropriate co-precursor, such as a lead, titanium, strontium and/or barium precursor may be delivered for deposition to a substrate to create a mixed metal film. For example, in a particular embodiment, at least one precursor according to Formula I-III and at least one co-precursor can be used to create a hafnium lanthanate, hafnium titanate, lanthanum zirconate, and/or zirconium titanate film.

In a particular embodiment, the mixed metal film formed is selected from the group consisting of oxides and nitrides of hafnium, zirconium, titanium, lanthanum and any other lanthanide-series metal. In another particular embodiment, the at least one precursor according to Formula I-III can be used to form a ferroelectric, lead zirconate titanate (PZT) film.

In a particular embodiment, the at least one precursor according to Formula I-III can be used to dope a metal oxide film, such as but not limited to hafnium lanthanum oxide, hafnium titanium oxide, lanthanum zirconium oxide, zirconium titanium oxide and hafnium cerium oxide. As used herein, when at least one precursor according to Formula I-III is used to dope a metal oxide film, the hafnium and/or zirconium may be substitutional or interstitial on the film-forming lattice.

D. PERMITTIVITY

A thin film created by a method of the invention can have a permittivity of between 10 and 250, preferably at least 25 to 40 and more preferably at least 40 to 100. Further, an ultra high permittivity can be considered to be a value higher than 100. It is understood by one of ordinary skill in the art that the resulting permittivity of the film depends on a number of factors, such as the metal(s) used for deposition, the thickness of the film created, the parameters and substrate employed during growth and subsequent processing.

In a particular embodiment, the at least one precursor according to Formula I-III can be used to form a metal-titanate film with an ultra high permittivity (high-κ) of over 100.

E. SUBSTRATES

A variety of substrates can be used in the methods of the present invention. For example, the precursors according to Formula I-III may be delivered for deposition on substrates such as, but not limited to, silicon, silicon oxide, silicon nitride, tantalum, tantalum nitride, or copper.

F. ALD TYPES

The ALD methods of the invention encompass various types of ALD processes. For example, in one embodiment conventional ALD is used to form a metal-containing film of the invention. For conventional and/or pulsed injection ALD process see for example, George S. M., et. al. *J. Phys. Chem.* 1996. 100:13121-13131.

In another embodiment, liquid injection ALD is used to form a metal-containing film, wherein a liquid precursor is delivered to the reaction chamber by direct liquid injection as opposed to vapor draw by a bubbler (conventional). For liquid injection ALD process see, for example, Potter R. J., et. al. *Chem. Vap. Deposition.* 2005. 11(3):159.

In a particular embodiment, at least one precursor corresponding in structure to Formula I is used to form a metal-containing film by liquid injection ALD.

In a particular embodiment, at least one precursor corresponding in structure to Formula II is used to form a metal-containing film by liquid injection ALD.

In a particular embodiment, at least one precursor corresponding in structure to Formula III is used to form a metal-containing film by liquid injection ALD.

Examples of liquid injection ALD growth conditions include, but are not limited to:

(1) Substrate temperature: 160-300° C. on Si(100)
(2) Evaporator temperature: about 175° C.
(3) Reactor pressure: about 5 mbar
(4) Solvent: toluene, or any solvent mentioned above
(5) Solution concentration: about 0.05 M
(6) Injection rate: about 2.5 μl pulse$^{-1}$ (4 pulses cycle$^{-1}$)
(7) Inert gas flow rate: about 200 cm$^3$ min$^{-1}$
(8) Pulse sequence (sec.) (precursor/purge/H$_2$O/purge): will vary according to chamber size.
(9) Number of cycles: will vary according to desired film thickness.

In one embodiment, at least one precursor corresponding in structure to Formula I-III is used to form a metal-containing film by liquid injection ALD, wherein the at least one precursor corresponding in structure to Formula I-III is dissolved in a solvent prior to delivery to the substrate. The precursor may be dissolved in an appropriate hydrocarbon or amine solvent. Appropriate hydrocarbon solvents include, but are not limited to aliphatic hydrocarbons, such as hexane, heptane and nonane; aromatic hydrocarbons, such as toluene and xylene; aliphatic and cyclic ethers, such as diglyme, triglyme and tetraglyme. Examples of appropriate amine solvents include, without limitation, octylamine and N,N-dimethyldodecylamine. For example, the precursor may be dissolved in toluene to yield a 0.05 to 1M solution.

In another embodiment, at least one precursor corresponding in structure to Formula I-III may be delivered "neat" (undiluted by a carrier gas) to the substrate.

In another embodiment, photo-assisted ALD is used to form a metal-containing film. For photo-assisted ALD processes see, for example, U.S. Pat. No. 4,581,249.

In a particular embodiment, at least one precursor corresponding in structure to Formula I is used to form a metal-containing film by photo-assisted ALD.

In a particular embodiment, at least one precursor corresponding in structure to Formula II is used to form a metal-containing film by photo-assisted ALD.

In a particular embodiment, at least one precursor corresponding in structure to Formula III is used to form a metal-containing film by photo-assisted ALD.

In another embodiment, both liquid injection and photo-assisted ALD may be used to form a metal-containing film using at least one precursor corresponding in structure to Formula I-III.

Thus, the organometallic precursors corresponding in structure to Formula I-III utilized in these methods may be liquid, solid, or gaseous. Particularly, the precursors are liquid at ambient temperatures with high vapor pressure for consistent transport of the vapor to the process chamber.

ALD relies substantially on chemical reactivity and not thermal decomposition. Therefore, there are fundamental differences in the characteristics desirable for a suitable precursor. The precursor must be thermally stable at the temperatures employed and should be sufficiently volatile to allow deposition onto the substrate. Further, when depositing a metal oxide or metal nitride film, a fast and complete chemical reaction is necessary between the metal precursor and the oxide or nitride source. However the reaction should only take place at the substrate surface so as not to damage the underlying structure and by-products, such as carbon and hydrogen, should be removed readily from the surface.

It has been discovered that variation of the substitution of the Cp ring and three identical ligands attached to the metal center demonstrates useful and improved properties for ALD processes. For example, the precursors of Formula I-III provide an increased ability to deposit metal oxide films by ALD at growth rates approaching that for simple metal amides but can operate at higher temperatures due to increased thermal stability which leads to improved product quality.

In particular embodiments, the methods of the invention are utilized for applications such as dynamic random access memory (DRAM) and complementary metal oxide semiconductor (CMOS) for memory and logic applications, on substrates such as silicon chips.

EXAMPLES

The following examples are merely illustrative, and do not limit this disclosure in any way. All manipulations were carried out in an inert atmosphere using a glove box and Schlenk line techniques. NMR analysis was carried out using a Bruker 250 MHz machine.

Example 1

Synthesis of (MeCp)Zr(NMe$_2$)$_3$

A Schlenk flask was charged with Zr(NMe$_2$)$_4$ (26.7 g, 0.1 mole) and anhydrous hexane (50 mls). Freshly cracked MeCpH (7.9 g, 0.1 mole) was then added over 10 minutes to the stirred solution at room temperature. A condenser was fitted and the mixture refluxed for 2 hours and the solvent then removed under reduced pressure. The crude material was distilled at 90° C., 0.001 Torr yielding pure (MeCp)Zr(NMe$_2$)$_3$ as a pale yellow oil in ~90% yield.

NMR (C$_6$D$_6$): 5.95 (m, 2H, C$_5$H$_4$), 5.85 (m, 2H, C$_5$H$_4$), 2.9 (s, 18H, N(CH$_3$)$_2$), 2.05 (s, 3H, CH$_3$ Cp)

| C, H, N: | C | H | N |
|---|---|---|---|
| Expected | 47.59 | 8.26 | 13.88 |
| Actual | 45.0 | 7.76 | 12.9 |

Example 2

Synthesis of (MeCp)Zr(OtBu)$_3$

A Schlenk flask was charged with (MeCp)Zr(NMe$_2$)$_3$ (30.3 g, 0.1 mole) and anhydrous hexane (50 mls). A second Schlenk flask was charged with tBuOH (22.2 g, 0.3 mole) and dissolved in anhydrous hexane (20 mls). The anhydrous solutions were then added over 30 minutes to the stirred zirconium solution at room temperature and the mixture stirred for 4 hours. The solvent was then removed under reduced pressure. The crude material was distilled at 70° C., 0.001 Torr yielding pure (MeCp)Zr(OtBu)$_3$ as a pale yellow oil in ~90% yield.

NMR (C$_6$D$_6$): 6.2 (m, 2H, C$_5$H$_4$), 6.1 (m, 2H, C$_5$H$_4$), 2.2 (s, 3H, CH$_3$ Cp), 1.2 (s, 27H, C(CH$_3$)$_3$.

| C, H, N: | C | H | N |
|---|---|---|---|
| Expected | 55.43 | 8.72 | 0 |
| Actual | 54.85 | 8.75 | 0 |

Example 3

Synthesis of (MeCp)Hf(NMe$_2$)$_3$

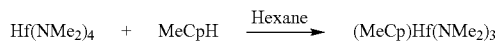

A Schlenk flask was charged with Hf(NMe$_2$)$_4$ (35.5 g, 0.1 mole) and anhydrous hexane (50 mls). Freshly cracked MeCpH (7.9 g, 0.1 mole) was then added over 10 minutes to the stirred solution at room temperature. A condenser was fitted and the mixture refluxed for 2 hours and the solvent then removed under reduced pressure. The crude material was distilled at 90° C., 0.00 Torr yielding pure (MeCp)Hf(NMe$_2$)$_3$ as a pale yellow oil in ~90% yield.

NMR (C$_6$D$_6$): 5.95 (m, 2H, C$_5$H$_4$), 5.8 (m, 2H, C$_5$H$_4$), 2.95 (s, 18H, N(CH$_3$)$_2$), 2.1 (s, 3H, CH$_3$Cp)

| C, H, N: | C | H | N |
|---|---|---|---|
| Expected | 36.93 | 6.41 | 10.77 |
| Actual | 36.8 | 6.46 | 10.45 |

Example 4

Synthesis of (MeCp)Hf(OtBu)$_3$

A Schlenk flask was charged with (MeCp)Hf(NMe$_2$)$_3$ (39.0 g, 0.1 mole) and anhydrous hexane (50 mls). A second Schlenk flask was charged tBuOH (22.2 g, 0.3 mole) and dissolved in anhydrous hexane (20 mls). The anhydrous solutions were then added over 30 minutes to the stirred hafnium solution at room temperature and the mixture stirred for 4 hours. The solvent was then removed under reduced pressure. The crude material was distilled at 70° C., 0.001 Torr yielding pure (MeCp)Hf(OtBu)$_3$ as a pale yellow oil in ~90% yield.

NMR (C$_6$D$_6$): 6.2 (m, 2H, C$_5$H$_4$), 6.05 (m, 2H, C$_5$H$_4$), 2.2 (s, 3H, CH$_3$Cp), 1.2 (s, 27H, C(CH$_3$)$_3$.

| C, H, N: | C | H | N |
|---|---|---|---|
| Expected | 45.29 | 7.13 | 0 |
| Actual | 46.85 | 7.39 | 0.3 |

Example 5

ALD of (MeCp)Zr(OtBu)$_3$

Zirconium oxide thin films are deposited in a custom-built ALD reactor. (MeCp)Zr(OtBu)$_3$ and ozone are used as precursors. The zirconium oxide films are deposited on silicon wafer substrates. Prior to deposition, the wafer substrates are prepared by dicing the wafer (1 inch×½ inch), and 1% HF polish.

The growth temperature is 200-350° C. The growth pressure is 0.5-1.5 Torr. The reactor is continuously purged with 30 sccm of dry nitrogen. All the computer controlled valves in the reactor are the air operated ALD VCR valves from Cajon.

Ozone is purged in excess. The zirconium is stored in a stainless steel ampoule. Attached directly to the ampoule is an ALD valve. The output of this ALD valve is Tee'd with another ALD valve used for nitrogen injection. The Tee outlet leg is connected to a 500 cm$^3$ stainless steel reservoir. The outlet of the reservoir is attached to a third ALD valve, called the inject valve, whose outlet goes directly to the reactor. Nitrogen injection is used to build up the total pressure behind the zirconium inject valve so that the pressure is higher than the reactor growth pressure. The injected nitrogen is accomplished using a 30 micron pin hole VCR gasket. All of the valves and ampoule are placed into an oven-like enclosure that allows the ampoule, valves, and tubing to be heated uniformly to 50° C. to 250° C.

During the ALD growth operation, the valves are sequenced in the following manner. The zirconium precursor is introduced to the activated silicon surface. A nitrogen purge then takes place which includes evacuation to remove surplus reactant molecules not attached to the surface. Ozone is then introduced as a co-reactant species, followed by an additional purge with nitrogen. The ozone is then injected to start the ALD cycle all over again.

The total amount of cycles is typically 300. Results show that the deposition rate is independent of the zirconium dose as varied through its vapor pressure, which in turn is varied through its evaporation temperature. This proves that the film growth proceeds in a self-limiting manner as is characteristic of ALD.

Example 6

ALD of (MeCp)Hf(OtBu)$_3$

Hafnium oxide thin films are deposited in a custom-built ALD reactor. (MeCp)Hf(OtBu)$_3$ and ozone are used as precursors. The hafnium oxide films are deposited on silicon wafer substrates. Prior to deposition, the wafer substrates are prepared by dicing the wafer (1 inch×½ inch), and 1% HF polish.

The growth temperature is 200-350° C. The growth pressure is 0.5-1.5 Torr. The reactor is continuously purged with 30 sccm of dry nitrogen. All the computer controlled valves in the reactor are the air operated ALD VCR valves from Cajon.

Ozone is purged in excess. The hafnium is stored in a stainless steel ampoule. Attached directly to the ampoule is an ALD valve. The output of this ALD valve is Tee'd with another ALD valve used for nitrogen injection. The Tee outlet leg is connected to a 500 cm$^3$ stainless steel reservoir. The outlet of the reservoir is attached to a third ALD valve, called the inject valve, whose outlet goes directly to the reactor. Nitrogen injection is used to build up the total pressure behind the hafnium inject valve so that the pressure is higher than the reactor growth pressure. The injected nitrogen is accomplished using a 30 micron pin hole VCR gasket. All of the valves and ampoule are placed into an oven-like enclosure that allows the ampoule, valves, and tubing to be heated uniformly to 50° C. to 250° C.

During the ALD growth operation, the valves are sequenced in the following manner. The hafnium precursor is introduced to the activated silicon surface. A nitrogen purge then takes place which includes evacuation to remove surplus reactant molecules not attached to the surface. Ozone is then introduced as a co-reactant species, followed by an additional purge with nitrogen. The ozone is then injected to start the ALD cycle all over again.

The total amount of cycles is typically 300. Results show that the deposition rate is independent of the hafnium dose as varied through its vapor pressure, which in turn is varied through its evaporation temperature. This proves that the film growth proceeds in a self-limiting manner as is characteristic of ALD.

All patents and publications cited herein are incorporated by reference into this application in their entirety.

The words "comprise", "comprises", and "comprising" are to be interpreted inclusively rather than exclusively.

What is claimed is:

1. A method of forming a metal-containing film by atomic layer deposition, the method comprising delivering at least one precursor to a substrate, wherein the at least one precursor corresponds in structure to Formula II:

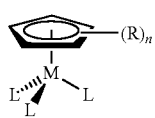

(Formula II)

wherein:
M is Hf or Zr;
R is $C_1$-$C_6$-alkyl;
n is zero, 1, 2, 3, 4 or 5;
L is $C_1$-$C_6$-alkoxy.

2. The method of claim 1, wherein
M is Hf
R is methyl, ethyl or propyl;
n is zero, 1 or 2; and
L is selected from the group consisting of methoxy, ethoxy, propoxy and butoxy.

3. The method of claim 1, wherein
M is Hf
R is methyl or ethyl;
n is 1 or 2; and
L is selected from the group consisting of methoxy, ethoxy, propoxy and butoxy.

4. The method of claim 1, wherein
M is Hf
R is methyl or ethyl;
n is 1; and
L is selected from the group consisting of methoxy, ethoxy, propoxy, and butoxy.

5. The method of claim 1, wherein
M is Zr;
R is methyl, ethyl or propyl;
n is zero, 1 or 2; and
L is selected from the group consisting of methoxy, ethoxy, propoxy and butoxy.

6. The method of claim 1, wherein
M is Zr;
R is methyl or ethyl;
n is 1 or 2; and
L is selected from the group consisting of methoxy, ethoxy, propoxy and butoxy.

7. The method of claim 1, wherein
M is Zr;
R is methyl or ethyl;
n is 1; and
L is selected from the group consisting of methoxy, ethoxy, propoxy and butoxy.

8. The method of claim 1, wherein the at least one precursor corresponding in structure to Formula II is selected from the group consisting of:
(methylcyclopentadienyl)Hf(OMe)$_3$;
(ethylcyclopentadienyl)Hf(OMe)$_3$;
(propylcyclopentadienyl)Hf(OMe)$_3$;
(methylcyclopentadienyl)Hf(OEt)$_3$;
(ethylcyclopentadienyl)Hf(OEt)$_3$;
(propylcyclopentadienyl)Hf(OEt)$_3$;
(methylcyclopentadienyl)Hf(OiPr)$_3$;
(ethylcyclopentadienyl)Hf(OiPr)$_3$;
(propylcyclopentadienyl)Hf(OiPr)$_3$;
(methylcyclopentadienyl)Hf(OtBu)$_3$;
(ethylcyclopentadienyl)Hf(OtBu)$_3$;
(propylcyclopentadienyl)Hf(OtBu)$_3$;
(methylcyclopentadienyl)Zr(OMe)$_3$;
(ethylcyclopentadienyl)Zr(OMe)$_3$;
(propylcyclopentadienyl)Zr(OMe)$_3$;
(methylcyclopentadienyl)Zr(OEt)$_3$;
(ethylcyclopentadienyl)Zr(OEt)$_3$;
(propylcyclopentadienyl)Zr(OEt)$_3$;
(methylcyclopentadienyl)Zr(OiPr)$_3$;
(ethylcyclopentadienyl)Zr(OiPr)$_3$;
(propylcyclopentadienyl)Zr(OiPr)$_3$;
(methylcyclopentadienyl)Zr(OtBu)$_3$;
(ethylcyclopentadienyl)Zr(OtBu)$_3$; and
(propylcyclopentadienyl)Zr(OtBu)$_3$.

9. The method of claim 1, wherein the at least one precursor corresponding in structure to Formula II is selected from the group consisting of:
(methylcyclopentadienyl)Hf(OtBu)$_3$; and
(methylcyclopentadienyl)Zr(OtBu)$_3$.

10. The method of claim 1, wherein the atomic layer deposition comprises photo-assisted atomic layer deposition.

11. The method of claim 1, wherein the atomic layer deposition comprises liquid injection atomic layer deposition.

12. The method of claim 1, wherein the precursor is deposited onto the substrate in pulses alternating with pulses of an oxygen source.

13. The method of claim 12, wherein the oxygen source is selected from $H_2O$, $O_2$ or ozone.

14. The method of claim 1, further comprising depositing at least one appropriate co-reactant selected from the group consisting of hydrogen, hydrogen plasma, oxygen, air, water, ammonia, hydrazines, alkylhydrazines, boranes, silanes, ozone and a combination thereof.

15. The method of claim 1, wherein at least two precursors corresponding in structure to Formula II are delivered to the substrate to form a metal-containing film by atomic layer deposition.

16. The method of claim 1, further comprising delivering to the substrate at least one co-precursor to form a mixed metal film by atomic layer deposition.

17. The method of claim 16, wherein the mixed metal film formed is selected from the group consisting of oxides and nitrides of hafnium, zirconium, titanium, lanthanum and any other lanthanide-series metal, and lead zirconate titanate.

18. The method of claim 1, wherein the metal-containing film is used for a memory and/or logic application.

19. A method of forming a metal-containing film by liquid injection atomic layer deposition, the method comprising delivering at least one precursor to a substrate, wherein the at least one precursor corresponds in structure to Formula III:

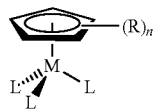

(Formula III)

wherein:
M is Hf or Zr;
R is $C_1$-$C_6$-alkyl;
n is 1, 2, 3, 4 or 5;
L is amino, wherein the amino is optionally independently substituted 1 or 2 times with $C_1$-$C_6$-alkyl.

20. The method of claim 19, wherein
M is Hf or Zr;
R is $C_1$-$C_6$-alkyl;
n is 1 or 2;
L is amino, wherein the amino is optionally independently substituted 1 or 2 times with $C_1$-$C_6$-alkyl.

21. The method of claim 19, wherein
M is Hf or Zr;
R is $C_1$-$C_6$-alkyl;
n is 3, 4 or 5;
L is amino, wherein the amino is optionally independently substituted 1 or 2 times with $C_1$-$C_6$-alkyl.

22. The method of claim 19, wherein the at least one precursor corresponding in structure to Formula III is selected from the group consisting of (methylcyclopentadienyl)Hf(NMe$_2$)$_3$; and (methylcyclopentadienyl)Zr(NMe$_2$)$_3$.

23. The method of claim 19, wherein the at least one precursor corresponding in structure to Formula III is dissolved in a solvent prior to delivery to the substrate.

24. The method of claim 19, wherein the at least one precursor corresponding in structure to Formula III is delivered neat to the substrate.

25. The method of claim 19, further comprising utilizing photo-assisted ALD to form the metal containing film.

* * * * *